US009071335B2

(12) United States Patent
Agarwal et al.

(10) Patent No.: US 9,071,335 B2
(45) Date of Patent: Jun. 30, 2015

(54) RADIO-FREQUENCY MODULES HAVING TUNED SHIELDING-WIREBONDS

(75) Inventors: Anil K. Agarwal, Ladera Ranch, CA (US); Dinhphuoc Vu Hoang, Stanton, CA (US); Howard E. Chen, Anaheim, CA (US); Anthony James LoBianco, Irvine, CA (US); Matthew Sean Read, Rancho Santa Margarita, CA (US); Hoang Mong Nguyen, Fountain Valley, CA (US); Guohao Zhang, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 251 days.

(21) Appl. No.: 13/543,084

(22) Filed: Jul. 6, 2012

(65) Prior Publication Data

US 2013/0021219 A1 Jan. 24, 2013

Related U.S. Application Data

(60) Provisional application No. 61/506,002, filed on Jul. 8, 2011.

(51) Int. Cl.

| | |
|---|---|
| ***H01Q 1/52*** | (2006.01) |
| ***H04B 1/3827*** | (2015.01) |
| ***H01L 23/552*** | (2006.01) |
| ***H05K 9/00*** | (2006.01) |

(52) U.S. Cl.

CPC ........... *H04B 1/3838* (2013.01); *Y10T 29/4913* (2015.01); *H01L 23/552* (2013.01); *H05K 9/0028* (2013.01); *H01L 2224/48227* (2013.01); *H01L 2924/1421* (2013.01); *H01L 2924/19107* (2013.01); *H01L 2924/3025* (2013.01)

(58) Field of Classification Search

USPC .......... 343/841, 700 MS; 257/422; 455/575.5

See application file for complete search history.

(56) References Cited

U.S. PATENT DOCUMENTS

| | | | | |
|---|---|---|---|---|
| 6,147,302 | A | 11/2000 | Matsuo et al. | |
| 7,030,469 | B2 | 4/2006 | Mahadevan et al. | |
| 7,088,009 | B2 | 8/2006 | Hagen | |
| 2007/0194995 | A1 * | 8/2007 | Fang et al. | 343/702 |
| 2007/0241440 | A1 * | 10/2007 | Hoang et al. | 257/685 |

OTHER PUBLICATIONS

International Search Report and Written Opinion of the International Searching Authority, issued on Jan. 10, 2013 in connection with related application No. PCT/US2012/045806.

* cited by examiner

*Primary Examiner* — Dieu H Duong

(74) *Attorney, Agent, or Firm* — Knobbe Martens Olson & Bear, LLP

(57) ABSTRACT

Disclosed are devices and methods related to radio-frequency (RF) shielding of RF modules. In some embodiments, tuned shielding can be achieved by utilizing different structures and/or arrangements of shielding-wirebonds to increase shielding in areas where needed, and to decrease shielding where not needed. Such tuning of shielding requirements can be obtained by measuring RF power levels at different locations of a module having a given design. Such tuned RF shielding configurations can improve the overall effectiveness of shielding, and can also be more cost effective to implement.

19 Claims, 18 Drawing Sheets

RADIO-FREQUENCY MODULES HAVING TUNED SHIELDING-WIREBONDS

CROSS-REFERENCE TO RELATED APPLICATIONS

This application claims the benefit of priority under 35 U.S.C. §119(e) of U.S. Provisional Application No. 61/506,002 filed on Jul. 8, 2011, which is incorporated herein by reference in its entirety.

BACKGROUND

1. Field

The present disclosure generally relates to shielding of radio-frequency devices such as modules used in wireless devices.

2. Description of the Related Art

Radio-frequency (RF) is a common term for a range of frequency of electromagnetic radiation typically used to produce and detect radio waves. Such a range can be from about 30 kHz to 300 GHz. In some situations, operation of an electronic device can adversely affect and/or be adversely affected by undesired RF signals.

To address such problems, RF shielding structures can be provided to reduce the effects of the undesired RF signals. Such RF shielding typically operate based on what is commonly referred to as a Faraday cage principle.

SUMMARY

According to a number of implementations, the present disclosure relates to a radio-frequency (RF) module that includes a packaging substrate configured to receive a plurality of components. The module further includes a plurality of RF components configured to facilitate processing of an RF signal. The module further includes an RF shield disposed relative to at least one of the RF components. The RF shield is configured to provide selective shielding capability based on either or both of an RF emission pattern and height dimensions associated with the RF components.

In some embodiments, the plurality of RF components can include a power amplifier die. In some embodiments, the RF shield can include a segment configured to provide a base-level of shielding. The selective shielding capability can be provided by an enhanced segment of the RF shield configured to provide an enhanced level of shielding that is greater than the base-level.

In some embodiments, the enhanced segment can include a higher density of shielding-wirebonds relative to a density associated with the base-level of shielding.

In some embodiments, the enhanced segment can include a corner shielding-wirebond disposed at a corner of the RF shield, with the corner shielding-wirebond being configured to provide additional shielding at the corner.

In some embodiments, the enhanced segment can include one or more shielding-wirebonds oriented so that planes associated with the shielding-wirebonds are at a non-zero angle relative to a line representative of the enhanced segment. The non-zero angle can be approximately 90 degrees.

In some embodiments, the enhanced segment can include a first row of shielding-wirebonds offset laterally from a second row of shielding-wirebonds. The shielding-wirebonds of the first row can be arranged in a stagger configuration relative to the shielding-wirebonds of the second row. One of the first and second rows can be part of the segment that provides the base-level of shielding.

In some embodiments, the enhanced segment can include one or more assemblies of shielding-wirebonds. Each assembly can include a first shielding-wirebond and a second shielding-wirebond that is nested within an area defined by the first shielding-wirebond. The second shielding-wirebond can be dimensioned to provide RF shielding within the area defined by the first shielding-wirebond. The area defined by the first shielding-wirebond can have an aspect ratio of about 1.

In some embodiments, the RF shield can include a segment configured to provide shielding between a first region and a second region, with both of the first and second regions being on the module. In some embodiments, the RF shield can include a segment configured to provide shielding between a region on the module and a location outside of the module. In some embodiments, the RF shield can partially surround the at least one RF component. In some embodiments, RF shield can fully surround the at least one RF component. In some embodiments, the module can further include a conductive layer disposed over the at least one RF component and electrically connected to an upper portion of the RF shield. In some embodiments, the module can further include a ground plane disposed below the at least one RF component and electrically connected to a lower portion of the RF shield. The conductive layer, the RF shield, and the ground plane can provide a shielded volume for the at least one RF component.

In some implementations, the present disclosure relates to a method for fabricating a radio-frequency (RF) module. The method includes providing a packaging substrate configured to receive a plurality of components. The method further includes mounting a plurality of RF components configured to facilitate processing of an RF signal. The method further includes forming an RF shield relative to at least one of the RF components. The RF shield is configured to provide selective shielding capability based on either or both of an RF emission pattern and height dimensions associated with the RF components.

In a number of implementations, the present disclosure relates to a wireless device that includes an antenna and a module in communication with the antenna. The module is configured to facilitate either or both of transmission and reception of RF signals through the antenna. The module includes a packaging substrate configured to receive a plurality of components. The module further includes a plurality of RF components configured to facilitate processing of an RF signal. The module further includes an RF shield disposed relative to at least one of the RF components. The RF shield is configured to provide selective shielding capability based on either or both of an RF emission pattern and height dimensions associated with the RF components.

DETAILED DESCRIPTION OF SOME EMBODIMENTS

The headings provided herein, if any, are for convenience only and do not necessarily affect the scope or meaning of the claimed invention.

Disclosed herein are various devices and methods for providing radio-frequency (RF) isolation or shielding for an active or a passive RF device. For the purpose of description, it will be understood that RF can include electromagnetic signals having a frequency or a range of frequencies associated with wireless devices. RF can also include electromagnetic signals that radiate within an electronic device, whether or not such an electronic device operates as a wireless device. RF can also include signals or noises typically associated with electromagnetic interference (EMI) effects.

For the purpose of description it will be understood that such an RF device can include a device configured to operate at an RF range to facilitate transmitting and/or receiving of RF signals, and a device that can influence another device by, or be influenced by, RF signals or noises. Non-limiting examples of such an RF device can include a semiconductor die with or without an RF circuitry. Non-limiting examples of such an RF-related device can include discrete devices such as inductors and capacitors, and even a length of a conductor.

For the purpose of description, it will be understood that the terms isolation and shielding can be used interchangeably, depending on the context of usage. For example, an RF device being shielded can include a situation where an RF signal from another source is being partially or fully blocked. In another example, an RF device being isolated can include a situation where an RF signal (e.g., noise or actively generated signal) is being partially or fully blocked from reaching another device. Unless the context of usage specifically states otherwise, it will be understood that each of the terms shielding and isolation can include either or both of the foregoing functionalities.

Figure 1:
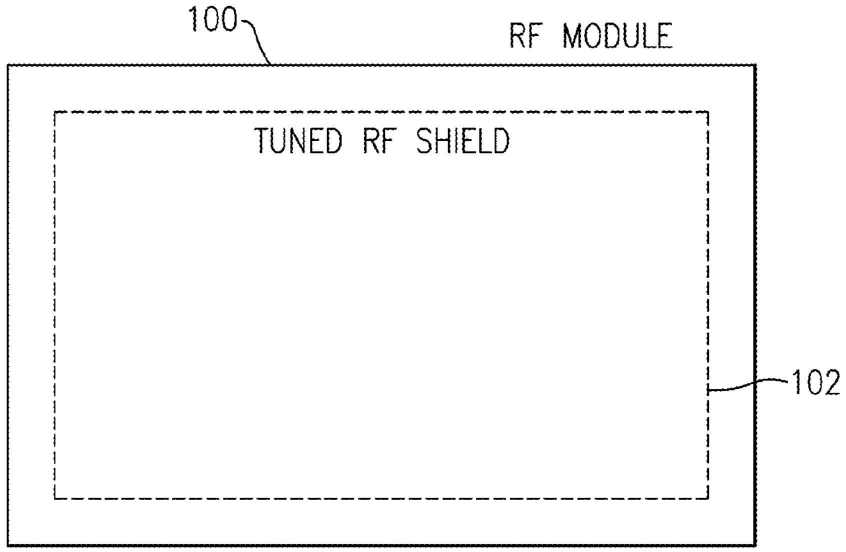
FIG. 1 schematically depicts a radio-frequency (RF) module that includes a tuned RF shield having one or more features as described herein.

FIG. 1 schematically depicts an RF module 100 having a tuned RF shield 102. Various examples of how such a tuned RF shield can be configured are described herein in greater detail. For the purpose of description, it will be understood that a "tuned" RF shield can be based on, for example, localized radiated power levels, mechanical considerations associated with shield structures, manufacturing considerations, or any combination thereof. In some embodiments, such a tuned RF shield can provide different shielding capabilities along a given shielding segment or perimeter.

Figure 2:
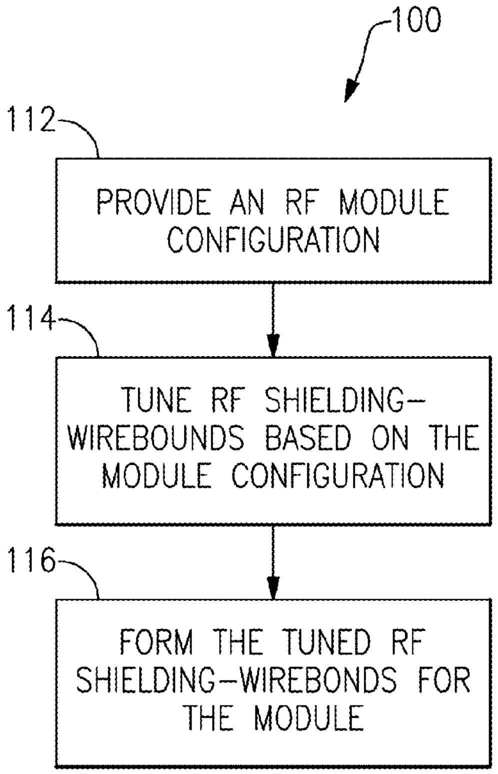
FIG. 2 shows a process that can be implemented to configure the tuned RF shield of FIG. 1.

FIG. 2 shows a process 110 that can be implemented to tune an RF shield for a given RF module configuration. In block 112, an RF module configuration can be provided. In block 114, RF shielding-wirebonds can be tuned based on the module configuration. In block 116, the tuned RF shielding-wirebonds can be formed for the module.

FIGS. 3-6 show examples of the tuning process described in reference to FIG. 2. FIGS. 7-19 show examples of shielding-wirebonds that can effectuate one or more tuned configurations resulting from the tuning process.

Figure 3A:
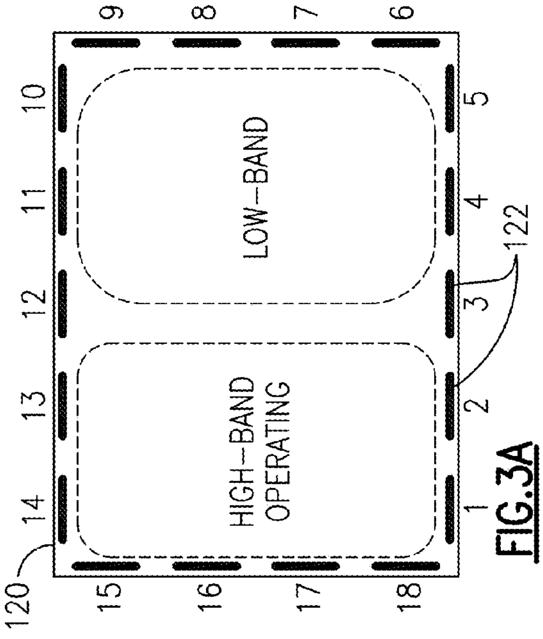
FIGS. 3 and 4 show an example of the tuning process of FIG. 2, where one or more locations on a module can be identified and selected to be provided with, for example, additional shielding.
Figure 3B:
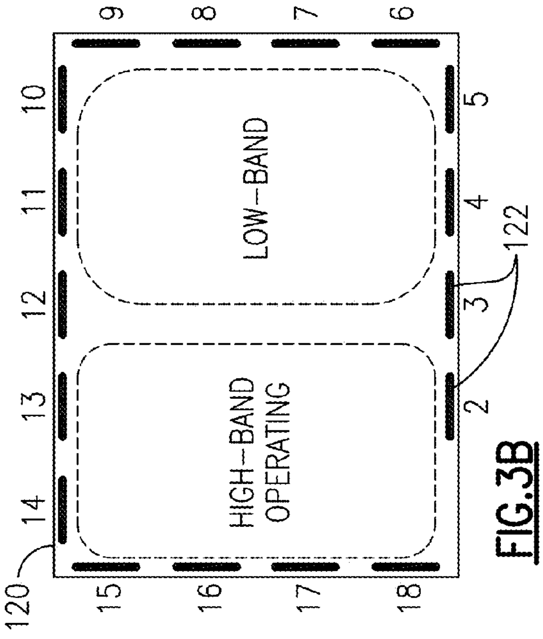

In FIG. 3A, an example power amplifier (PA) module 120 is shown to include a high-band PA circuit that is operating at approximately 1.71 GHz, and a low-band PA circuit that is not operating. Both of the high-band and low-band circuits are shown to be surrounded by shielding-wirebonds 122 indicated as 1-18. The wirebonds 122 are generally the same, and are spaced apart generally uniformly in a given side. In each of the high-band and low-band circuits, an input to the PA circuit is near the bottom of the region (dashed region), and an output of the PA circuit is near the top of the region.

Figure 4A:
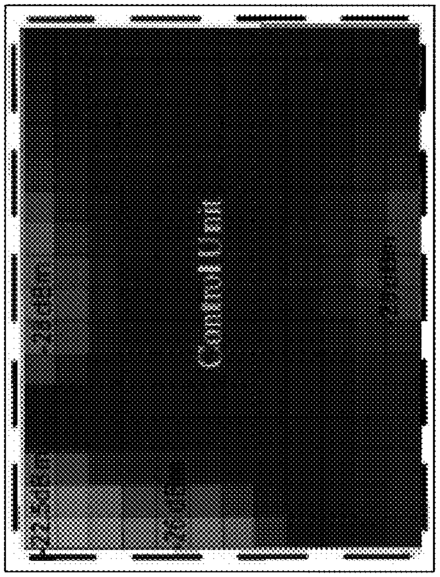
Figure 4B:
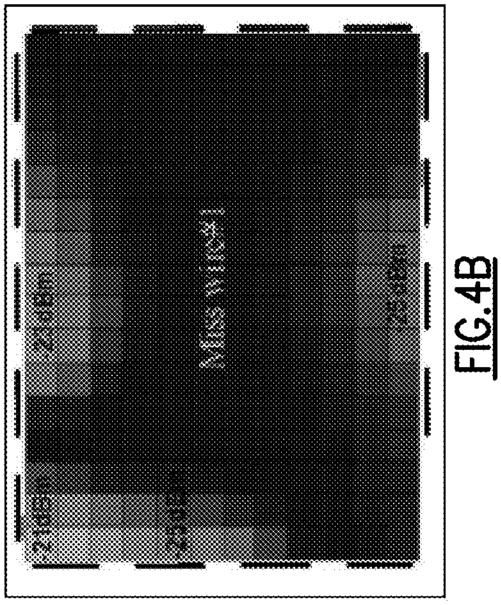
Figure 3D:
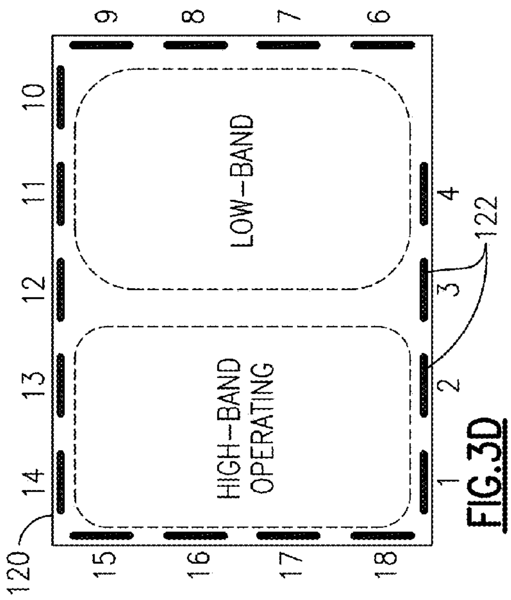
Figure 4D:
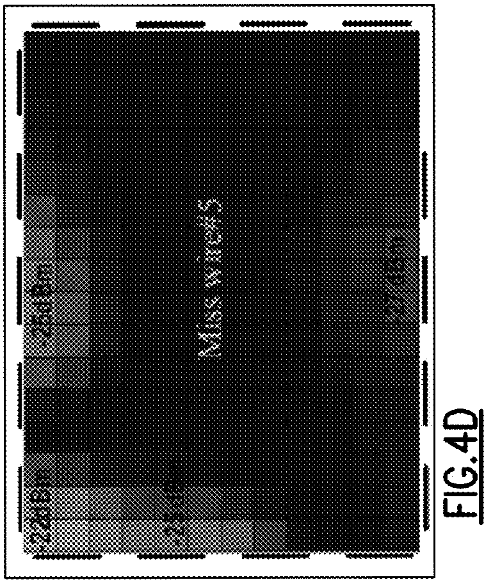
Figure 3C:
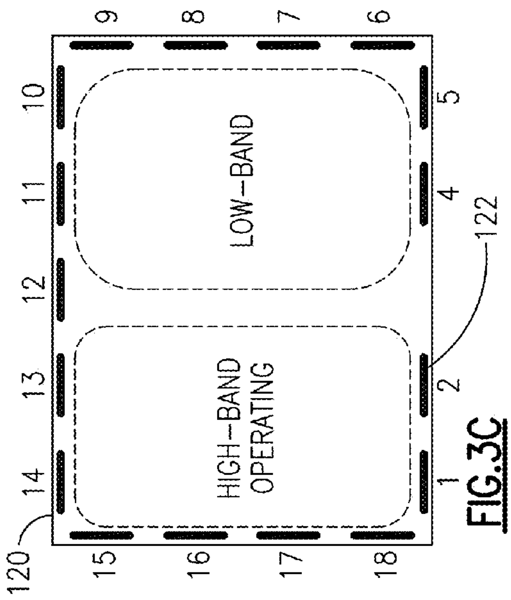
Figure 4C:
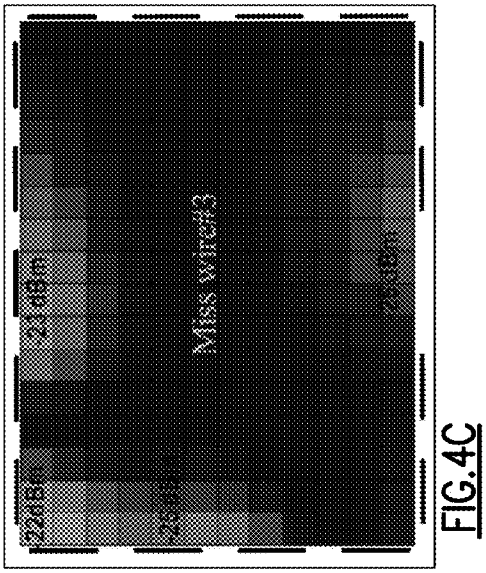
Figure 3E:
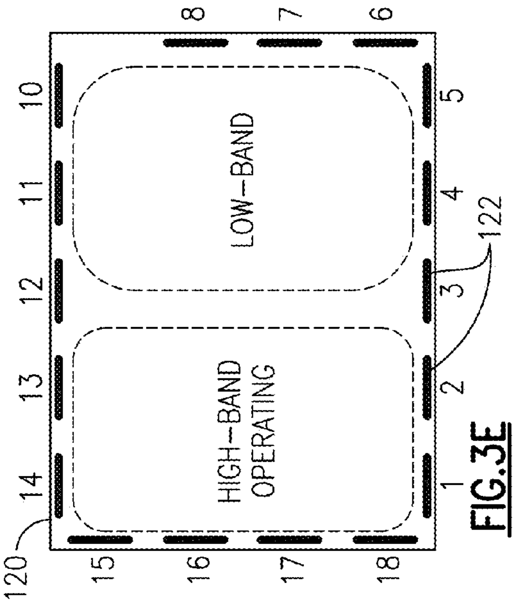
Figure 4E:
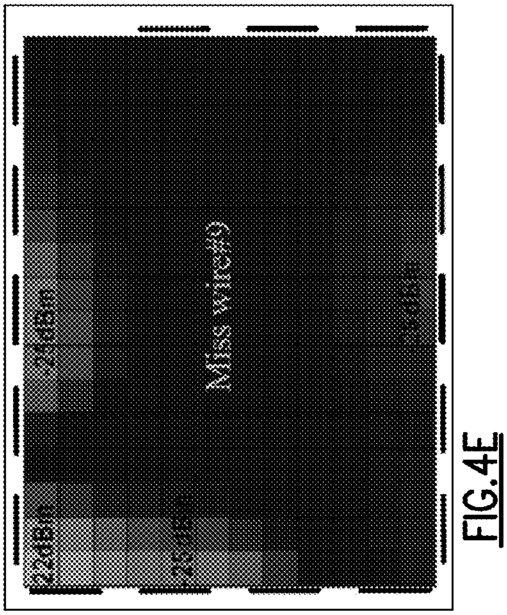
Figure 3F:
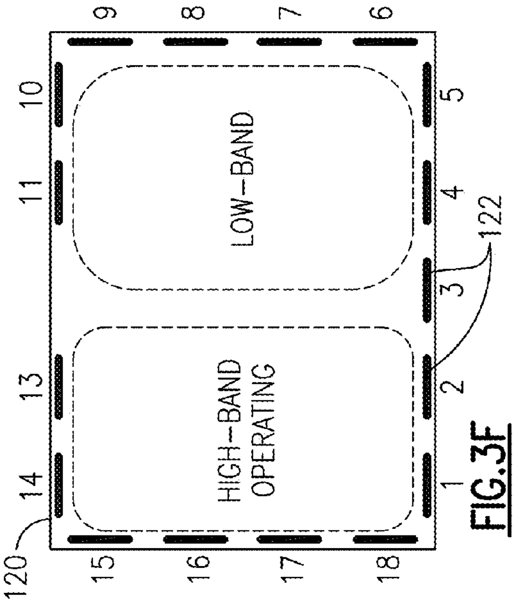
Figure 4F:
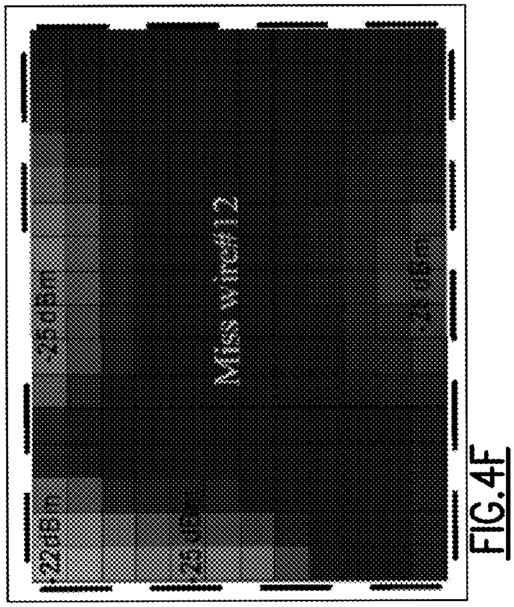
Figure 3H:
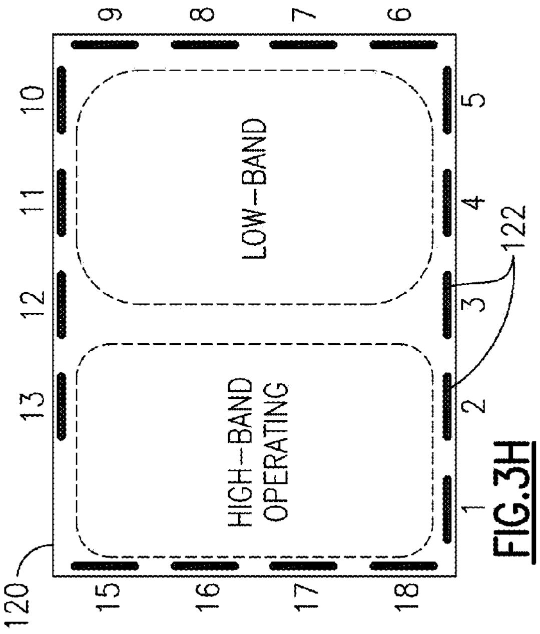
Figure 4H:
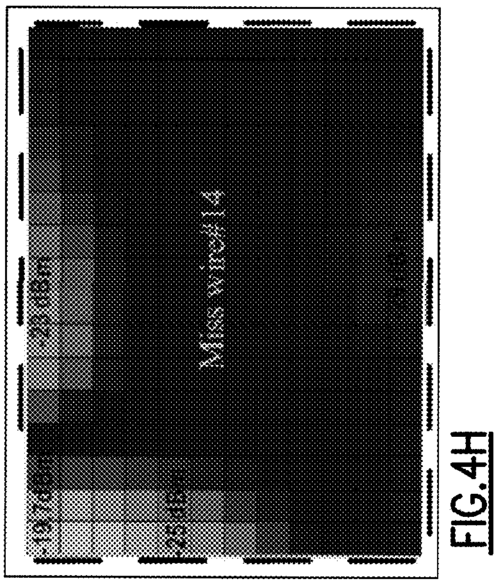
Figure 3G:
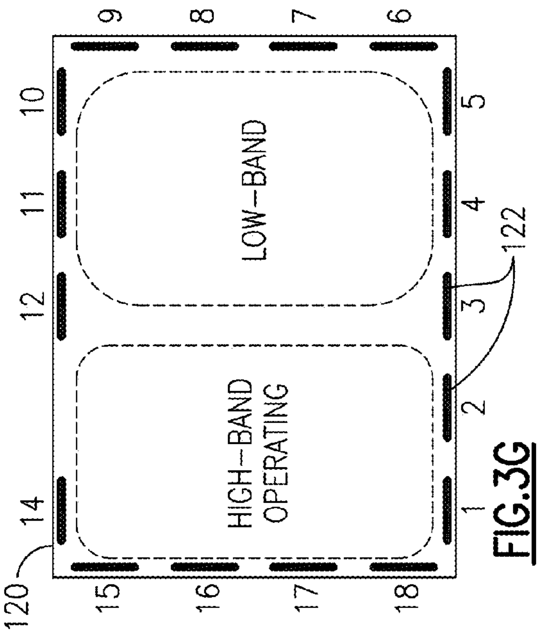
Figure 4G:
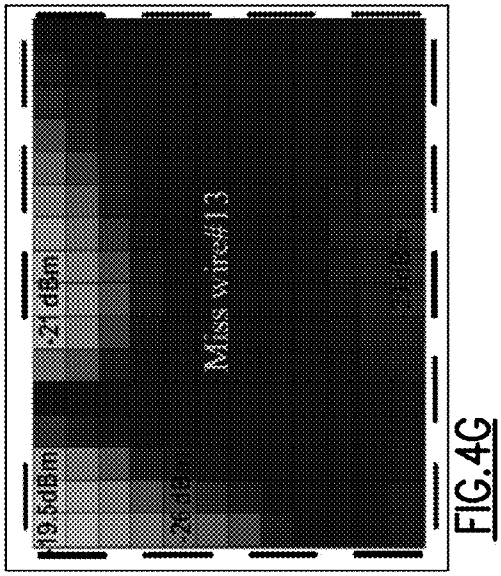
Figure 3I:
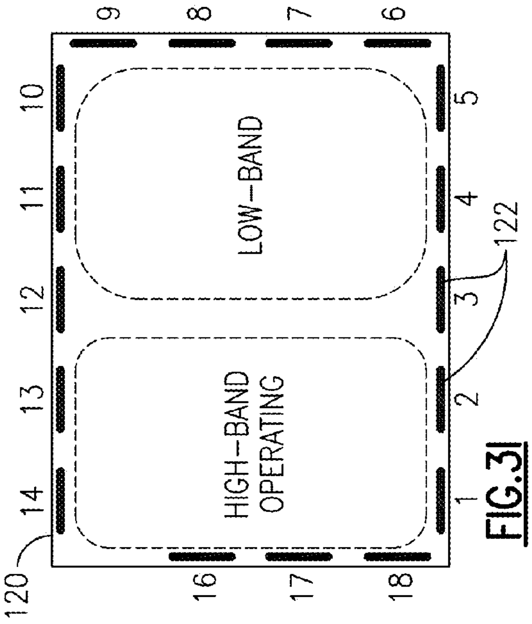
Figure 3J:
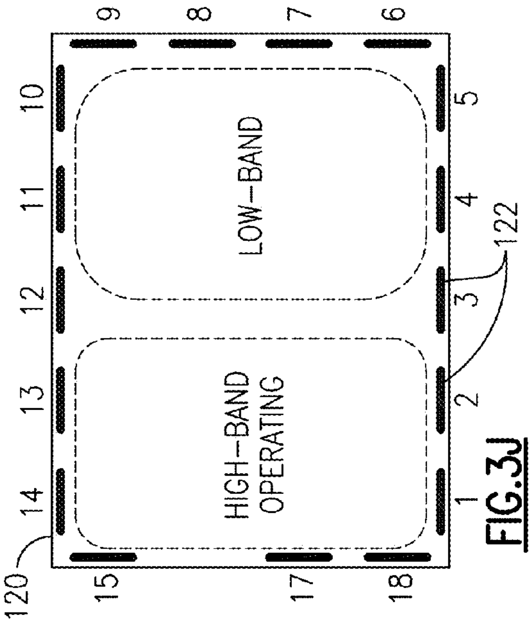
Figure 4I:
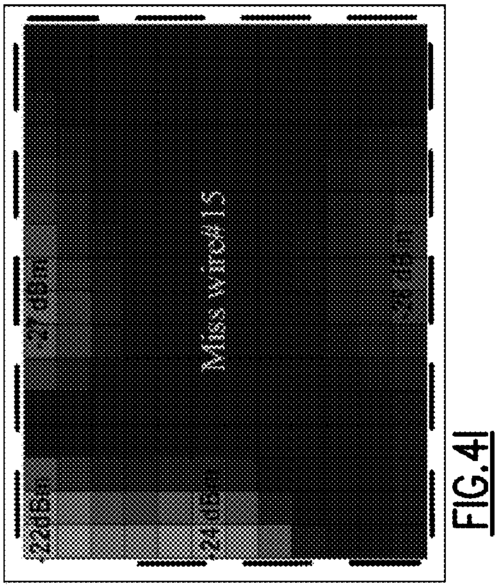
Figure 4J:
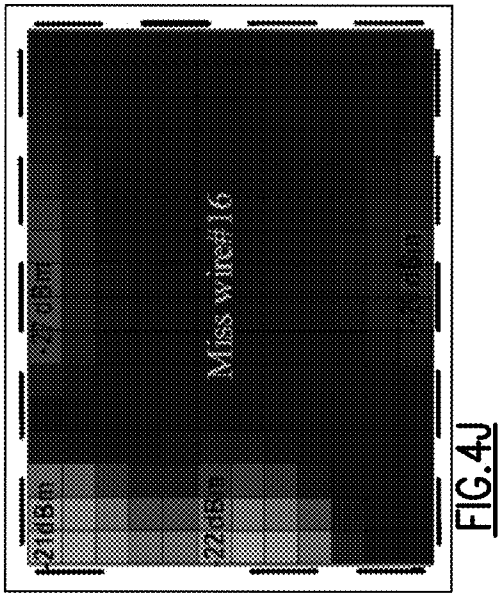
Figure 3L:
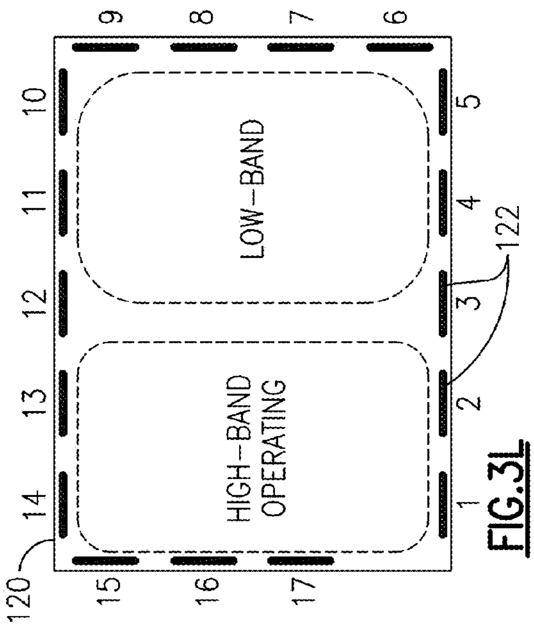
Figure 4L:
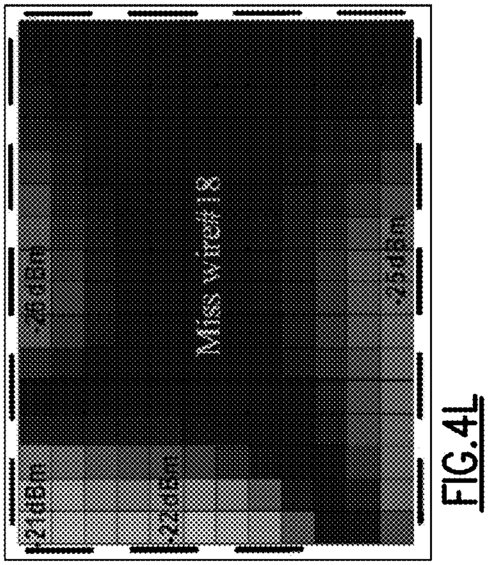
Figure 3K:
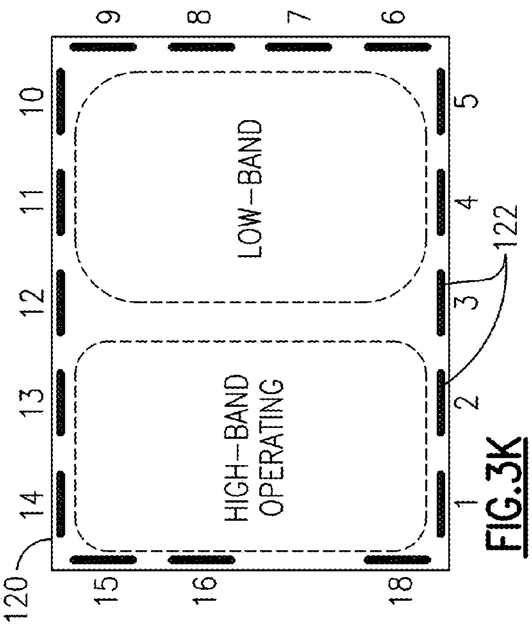
Figure 4K:
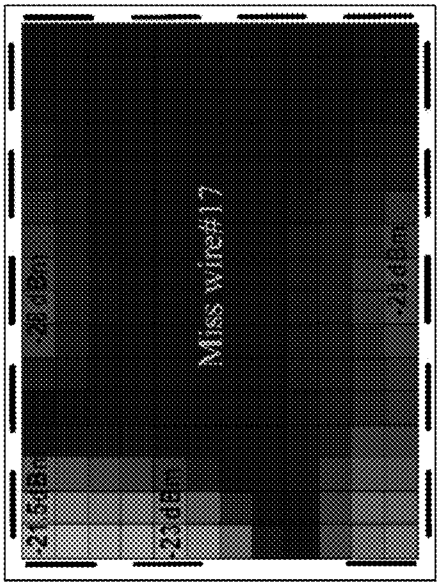
Figure 5A:
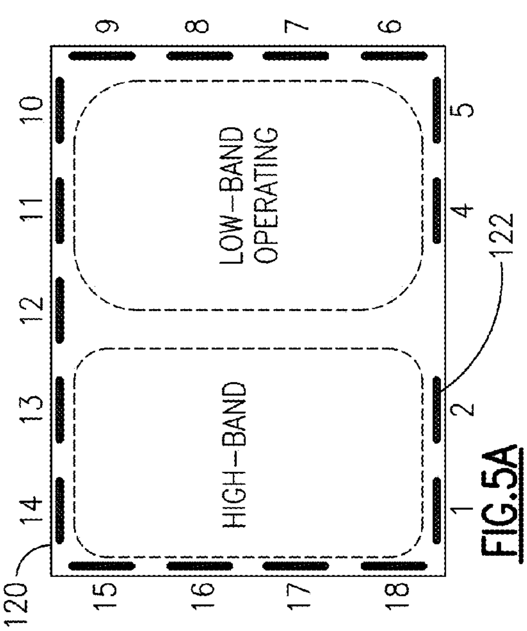
FIGS. 5 and 6 show another example of the tuning process of FIG. 2.
Figure 5B:
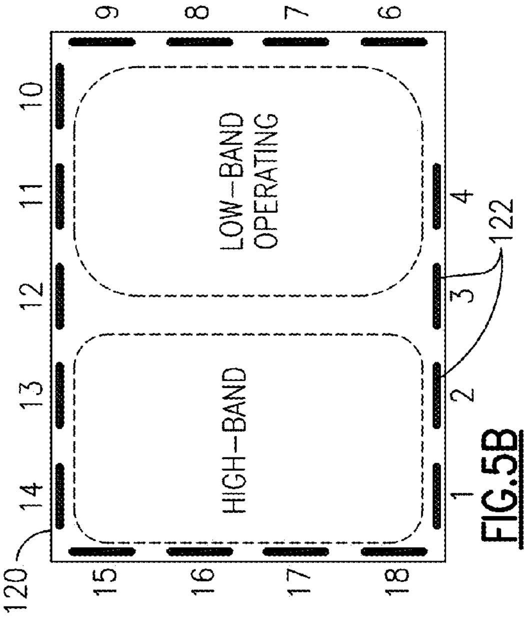
Figure 6A:
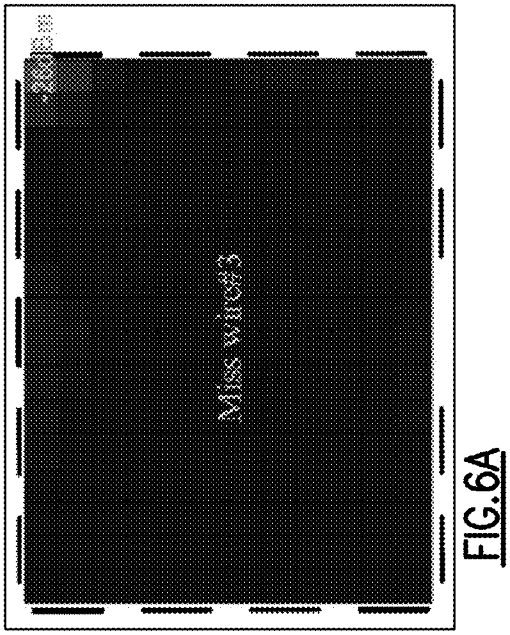
Figure 6B:
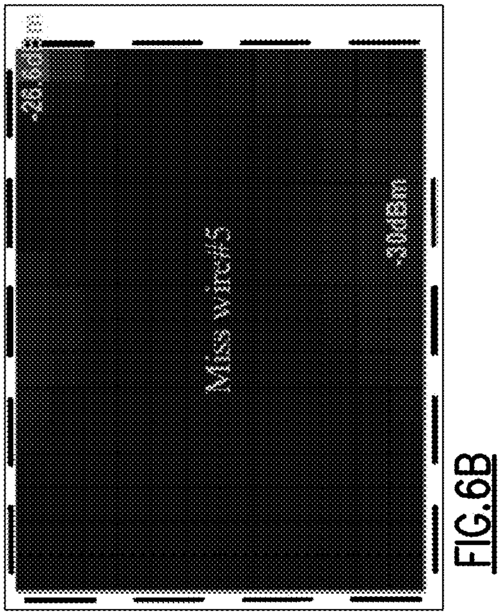
Figure 5C:
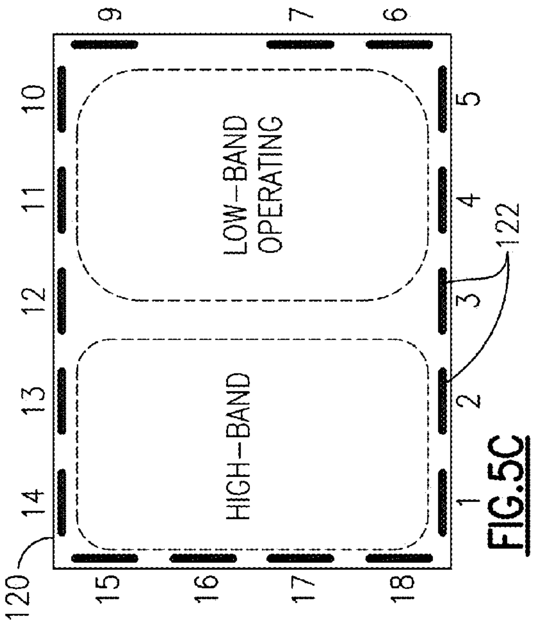
Figure 5D:
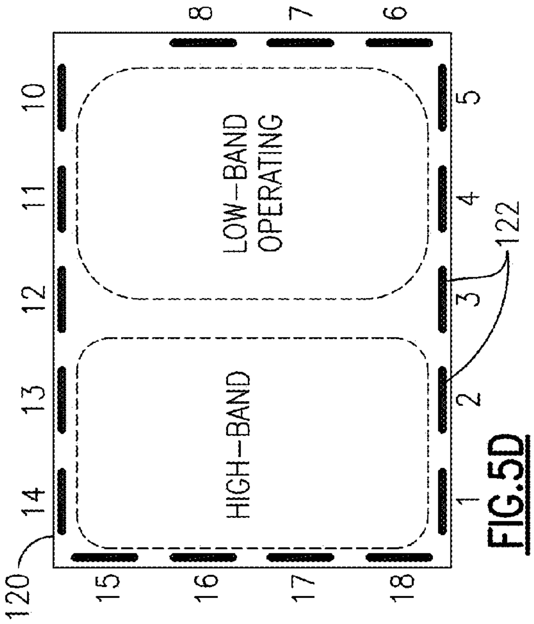
Figure 6C:
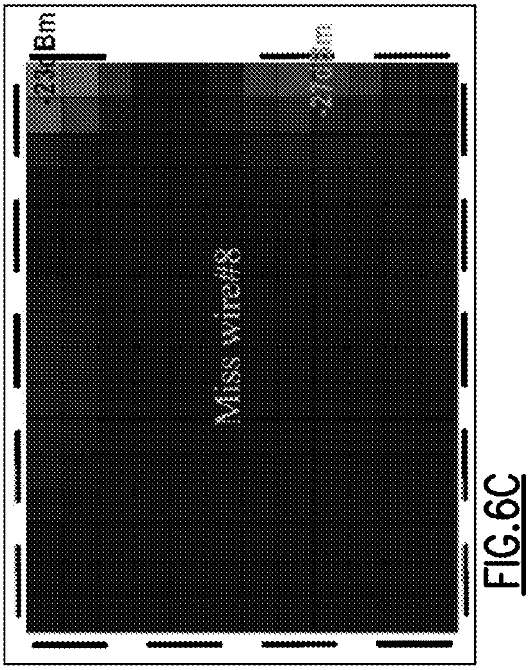
Figure 6D:
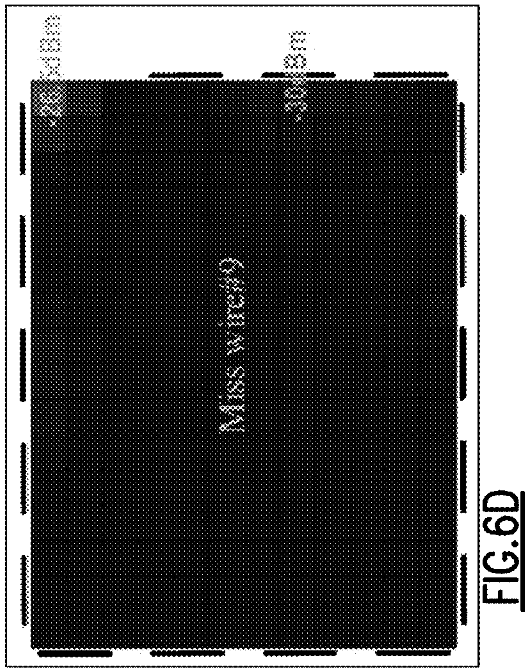

FIG. 4A shows a segmented contour plot of radiated power for the region surrounded by the eighteen shielding-wirebonds 122. Darker shaded segments correspond to lower radiated power levels, and lighter shaded segments correspond to higher radiated power levels. The example configuration of FIGS. 3A and 4A is designated as a control configuration where all of the eighteen example shielding-wirebonds 122 are present.

FIGS. 3B-3L and 4B-4L correspond to configurations where one of the eighteen shielding wirebonds 122 is removed. Table 1 lists additional details of such configurations, as well as the control configuration of FIGS. 3A and 4A.

TABLE 1

| Figures | Wirebond removed | Changes in radiated power level |
|---|---|---|
| 3A, 4A | None | N/A |
| 3B, 4B | #1 | Minimal |
| 3C, 4C | #3 | Minimal |
| 3D, 4D | #5 | Minimal |
| 3E, 4E | #9 | Minimal |
| 3F, 4F | #12 | Minimal |
| 3G, 4G | #13 | Significant |
| 3H, 4H | #14 | Significant |
| 3I, 4I | #15 | Moderate |
| 3J, 4J | #16 | Moderate |
| 3K, 4K | #17 | Moderate |
| 3L, 4L | #18 | Moderate |

In Table 1, changes in radiated power level can be categorized as follows: "minimal," where the changes result in levels that are within a given specification, "moderate," where the changes are worse, but the resulting levels are still within specification, and "significant," where the changes result in levels that are out of specification at one or more locations.

FIGS. 5A-5D and 6A-6D correspond to configurations where one of the eighteen shielding wirebonds 122 is removed, with the high-band PA circuit not operating, and the low-band PA circuit operating at approximately 0.824 GHz. Table 2 lists additional details of such configurations.

TABLE 2

| Figures | Wirebond removed | Change in radiated power level |
|---|---|---|
| 5A, 6A | #3 | Minimal |
| 5B, 6B | #5 | Minimal |
| 5C, 6C | #8 | Minimal |
| 5D, 6D | #9 | Minimal |

In Table 2, changes in radiated power levels are shown to be less than those associated with the high-band example of Table 1.

Based on the foregoing examples, some observations can be made. For example, in the high-band operation configuration, RF shielding effectiveness is relatively low near the output area. Removal of either of shielding-wirebonds #13 and #14 results in the RF shielding performance being out of specification at one or more locations. Removal of any of shielding-wirebonds #15 to #18 also degrade RF shielding performance somewhat, but within specification.

For the low-band operation configuration, RF shielding performance is less sensitive to removal of shielding-wirebonds than that of the foregoing high-band operation.

From the foregoing examples described in reference to FIGS. 3-6, one can see that for a given module configuration, shielding areas that are subject to significant shielding performance changes can be identified. Similarly, shielding areas that are not subject to significant shielding performance changes can also be identified. In some implementations, the first of these two shielding areas can be reinforced to provide greater shielding, and the second shielding areas can be configured to provide lesser shielding (e.g., by removing shielding-wirebond(s)).

Figure 7A:
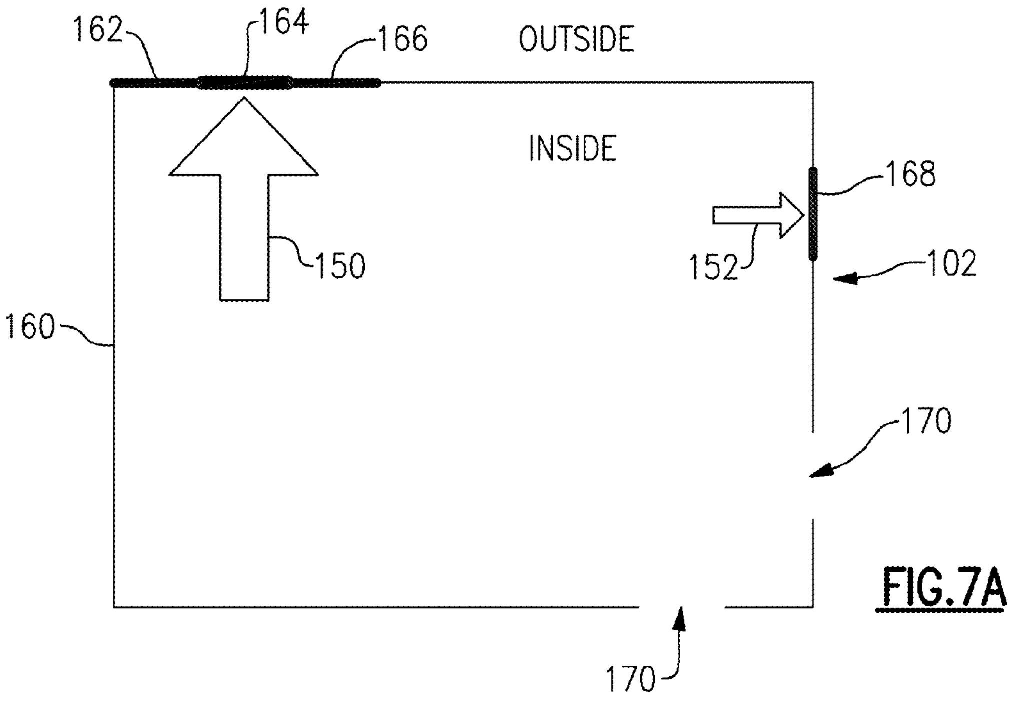
FIG. 7A schematically depicts a tuning configuration where one or more RF emissions from within a given area are identified, and where shielding capabilities are adjusted accordingly.

FIG. 7A schematically depicts an example tuned RF shield 102 having one or more portions where shielding capability is increased, and one or more portions where shielding capability is decreased. In some embodiments, such increase and/or decrease in shielding capability can be relative to a base shielding configuration 160 (e.g., FIG. 10).

In FIG. 7A, a relatively high level of RF emission is depicted as 150, and it is desired that such emission be prevented from leaving the area defined by the RF shield 102. To facilitate such shielding, increased shielding capability can be provided to segments indicated as 162, 164, and 166. Among such segments, there can be one or more levels of increase shielding capabilities. For example, segments 162 and 166 can be configured to provide a shielding capability that is greater than that of the base level 160; and segment 164 can be configured to provide even greater shielding capability than that of segments 162, 166.

Also in FIG. 7A, another example of a relatively high level of RF emission is depicted as 152. To facilitate shielding of such an increased emission level, a segment indicated as 168 can be provided. Examples of such enhanced shielding-capability configurations (162, 164, 166, 168) are described herein in greater detail.

FIG. 7A also shows that for areas where emission levels are relatively low, shielding capability can be reduced without significantly impacting the performance of circuits and components within the RF shield 102. For example, segments of the base level shielding 160 that would be located at locations 170 can be removed. In some implementations, such removal of shielding-wirebonds can reduce time and cost associated with fabrication of modules.

In the example described in reference to FIG. 7A, the RF shield 102 generally defines an inside region and an outside region. The example emissions 150, 152 are described in the context of originating from the inside and prevented from radiating to locations on the outside. It will be understood, however, that shielding segments can also inhibit RF signal or noise from entering the inside from the outside.

Figure 7B:
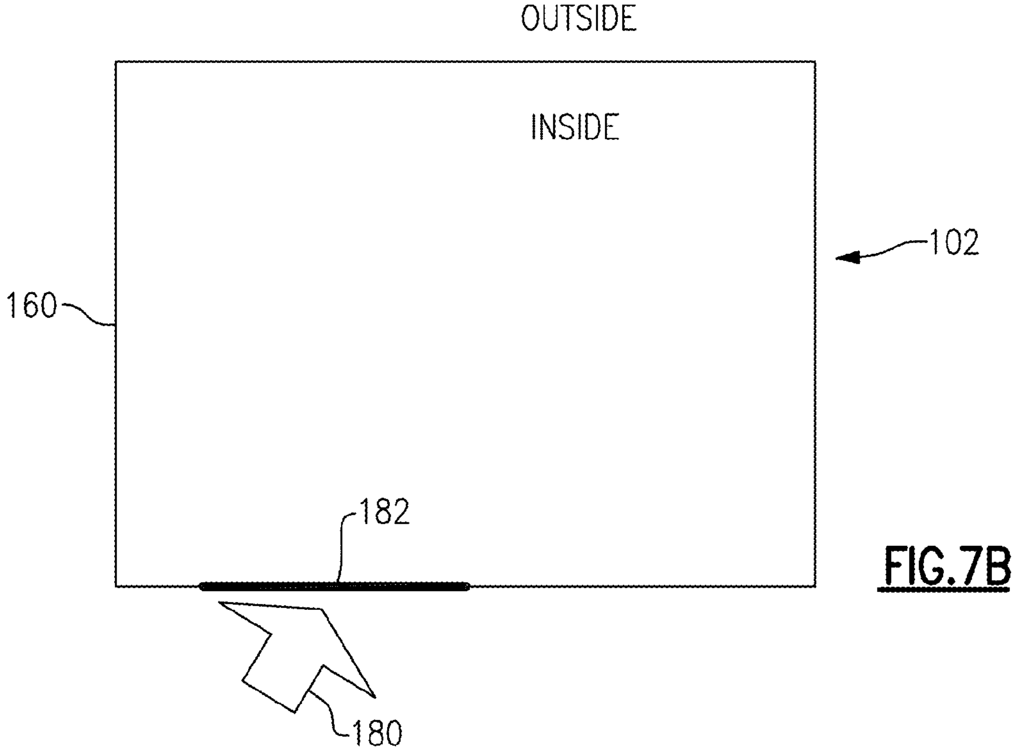
FIG. 7B schematically depicts a tuning configuration where one or more RF emissions from outside a given area are identified, and where shielding capabilities are adjusted accordingly.

FIG. 7B shows that tuning of an RF shield 102 can also be based on one or more emission sources located outside of the RF shield 102. Unlike the example of FIG. 7A (where emission locations are generally fixed) emission-source locations outside of the RF shield 102 may or may not be fixed. For the purpose of description, suppose that such a location is fixed (e.g., a component fixed outside of a module), and such an emission 180 attempting to enter the RF shield 102 is localized. One or more shielding segments 182 can be configured to provide increased shielding capability in manners similar to those described in reference to FIG. 7A.

In some implementations, increased shielding capability segments can be based on known emission sources that are located inside and outside of a region defined by an RF shield 102.

In the examples described in reference to FIGS. 7A and 7B, regions generally delineated by an RF shield 102 are referred to as "inside" and "outside." Such terms can be suitable for describing configurations where the RF shield 102 substantially encloses a given area. However, it will be understood that one or more features described herein do not require that an RF shield enclose an area being shielded.

Figure 8:
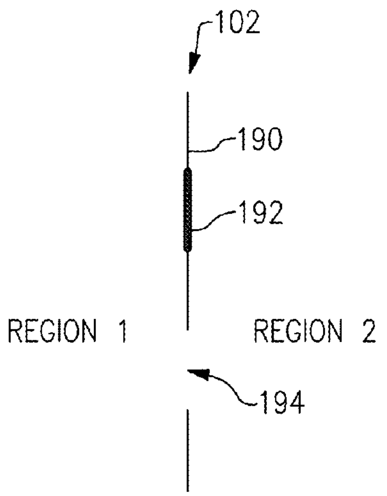
FIG. 8 shows a more generalized configuration that can cover the examples of FIGS. 7A and 7B, where a shielding configuration between first and second regions can be adjusted to provide RF isolation between the two regions in an effective manner.

FIG. 8 shows that in some implementations, an RF shield 102 can prevent RF signals from passing between first and second regions. In the example shown, the RF shield 102 is depicted as a line having a base-level shield 190. Based on such a shield (190), one or more segments (e.g., segment 192) having increased shielding capability can be provided. Also, one or more segments can be configured with reduced shielding capability (e.g., shielding segment removed from location 194).

It will be understood that although the RF shield 102 is depicted as a straight line, other shapes (e.g., curved) can also be utilized.

Figure 9A:
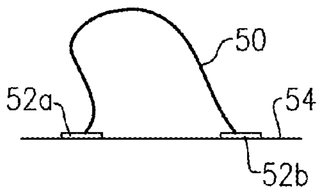
FIGS. 9A-9C show non-limiting examples of wirebond structures that can be utilized to facilitate various tuned RF shielding examples described herein.
Figure 9B:
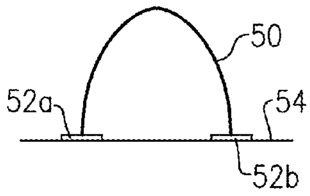
Figure 9C:
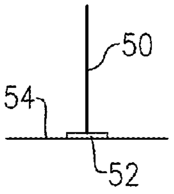

In some implementations, various RF shield segments and/or lines described herein can be based on a number of shielding-wirebond shapes. FIGS. 9A-9C show non-limiting examples of such shielding wirebonds. In FIG. 9A, a shielding-wirebond 50 having a deformable configuration is shown to be formed on bond pads 52*a*, 52*b* that are on a packaging substrate 54 (e.g., laminate substrate). Additional details concerning such a wirebond configuration are available in International Publication No. WO 2010/014103 (International Application No. PCT/US2008/071832, filed on Jul. 31, 2008, titled "SEMICONDUCTOR PACKAGE WITH INTEGRATED INTERFERENCE SHIELDING AND METHOD OF MANUFACTURE THEREOF") which is incorporated herein by reference in its entirety.

In FIG. 9B, an arch shaped shielding-wirebond 50 is shown to be formed on bond pads 52*a*, 52*b* that are on a packaging substrate 54 (e.g., laminate substrate). Additional details concerning such a wirebond configuration are available in U.S. Publication No. US 2007/0241440 (U.S. application Ser. No. 11/499,285, filed on Aug. 4, 2006, titled "OVERMOLDED SEMICONDUCTOR PACKAGE WITH A WIREBOND CAGE FOR EMI SHIELDING") which is incorporated herein by reference in its entirety.

FIG. 9C shows that in some embodiments, shielding-wirebonds do not need to be curved or have ends that begin and end on the packaging substrate. A wirebond structure 50 that begins on the packaging substrate 54 and ends at a location above the packaging substrate 54 is shown to be formed on a bond pad 52. Additional details concerning such a wirebond configuration are available in the above-referenced U.S. Publication No. US 2007/0241440.

Figure 10:
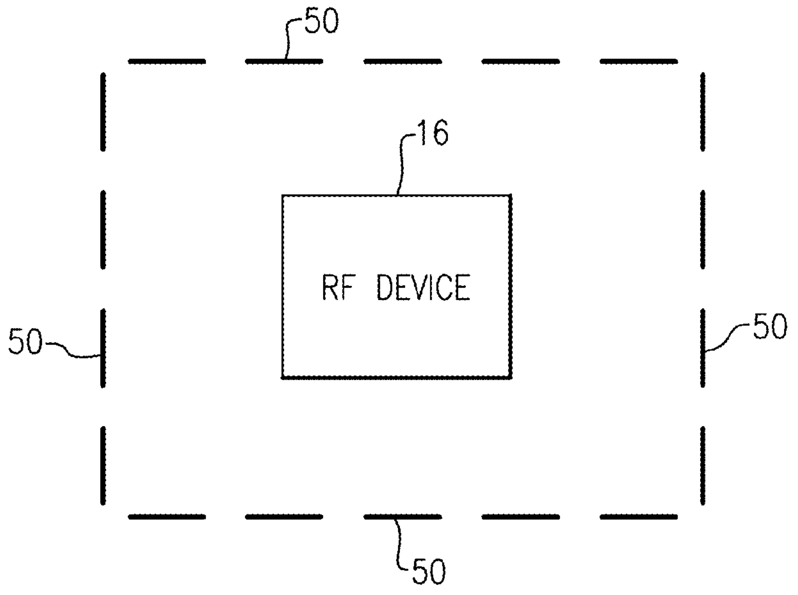
FIG. 10 shows an example configuration where shielding capability is generally uniform around a periphery of a module.

FIG. 10 shows an example of a base-level shielding capability that can be formed by a plurality of shielding-wirebonds 50 such as one or more of the examples of FIGS. 9A-9C. Such wirebonds are shown to be generally aligned along a perimeter that surrounds an RF device 16. FIGS. 11-19 show examples of RF shields that can provide additional or less shielding capability compared to, for example, the base-level shielding configuration of FIG. 10.

Figure 11:
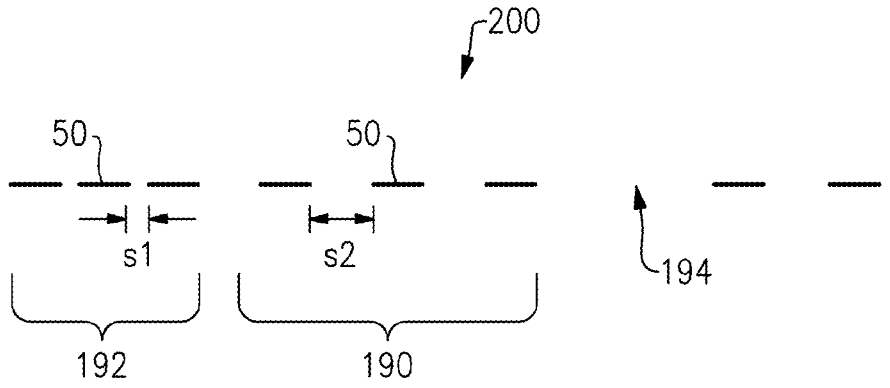
FIG. 11 shows an example configuration where shielding capability can vary based on different wirebond densities along a given shielding line.

FIG. 11 shows an example shielding configuration 200 where a plurality of shielding-wirebonds 50 are generally aligned along a shielding line. In this example, spacing between the wirebonds 50 and/or lateral dimensions of such wirebonds can be adjusted to provide different RF shielding characteristics. For example, suppose that a segment indicated as 190 has wirebonds 50 separated by "s2" to yield a first wirebond density that provides a base-level shielding. Different shielding characteristics can be provided by arranging the wirebonds 50 in a more dense (e.g., segment 192 with separation distance "s1") arrangement, or in a less dense (e.g., one or more removed from location 194) arrangement. In some embodiments, such wirebond-density segments can be based on locations of identified emission hotspots and frequencies associated with such emissions.

Figure 12A:
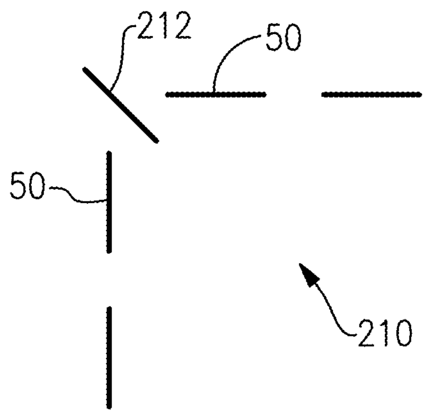
FIGS. 12A and 12B show example configurations where shielding capability can be increased for one or more corner regions.

FIG. 12A shows an example configuration 210 that can be implemented to provide a desired shielding configuration at a corner defined by two lines of wirebonds 50. A corner wirebond 212 is shown to be arranged along a direction that, for example, divides the corner into two equal or unequal parts. By way of an example, such a corner wirebond can be provided if an emission hotspot is near the corner.

Figure 12B:
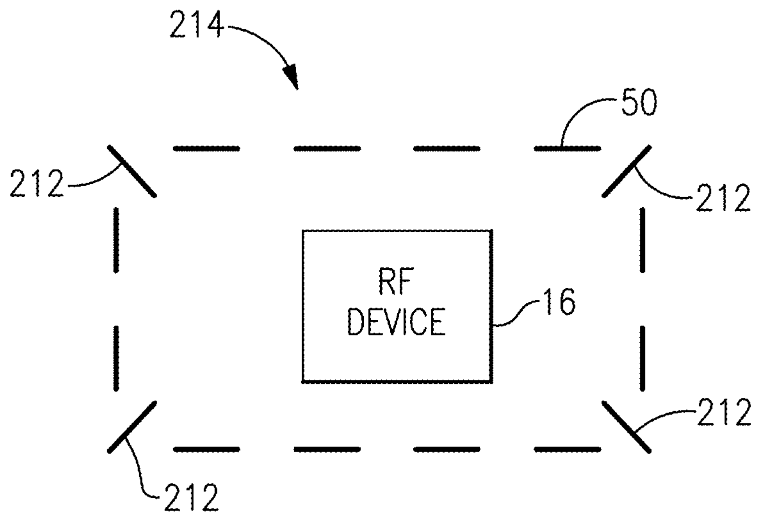

FIG. 12B shows that in some embodiments, such a corner shielding-wirebond 212 can be provided at one or more corners of a shielding configuration 214 where wirebonds 50 generally surround an RF device 16 (e.g., in a rectangular manner). For each side of the rectangle, a number of wirebonds 50 can be oriented so that planes defined by such wirebonds are generally aligned along the side of the rectangle. The corner wirebonds 212 are shown to be positioned at each of the corners so as to provide a narrower gap between the end wirebonds of the two adjacent sides. In the example shown in FIG. 12B, each of the corner wirebonds is shown to be oriented such that its plane divides the angle defined by the corner. The dimensions of each wirebond and spacings between the wirebonds can be selected to provide a desired RF shielding functionality.

Figure 13A:
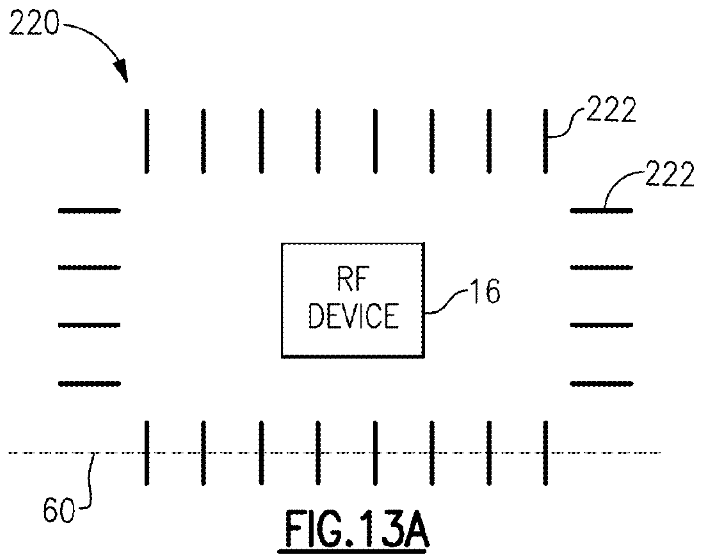
FIGS. 13A and 13B show an example configuration where shielding-wirebonds can be oriented to be generally perpendicular to a given shielding line that can effectively provide depth in shielding.

In an example configuration 220 of FIG. 13A, an RF device 16 is depicted as being surrounded by a plurality of wirebonds 222 in a rectangular box shaped pattern. For each side of the rectangle, the wirebonds 222 can be oriented so that planes defined by the wirebonds are generally perpendicular to the side of the rectangle. For example, one row of perpendicular wirebonds 222 are shown to be perpendicular to a line 60 representative of that side of the rectangle. The dimensions of each wirebond and spacings between the wirebonds can be selected to provide a desired RF shielding capability.

Figure 13B:
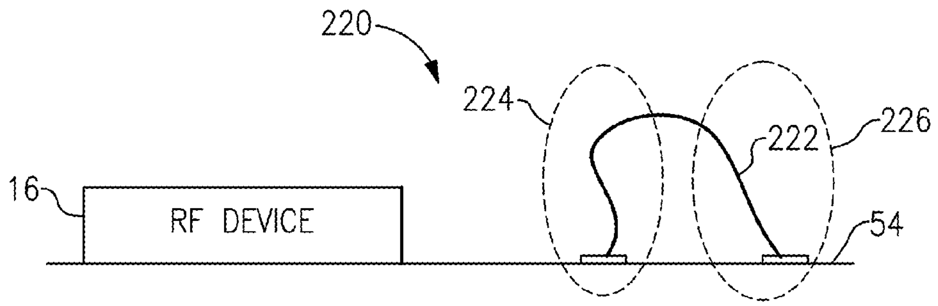

FIG. 13B shows a side view of one of the wirebonds 222 of FIG. 13A. Although the wirebond 222 is depicted as a deformable wirebond (e.g., FIG. 9A) other looped configurations (e.g., arch configuration of FIG. 9B) can also be implemented. To the left of the wirebond 222 is the RF device 16 (e.g., inside). By placing the wirebond 222 in such a manner, an RF emission radiating from the RF device 16 can be encounter a first portion 224 of the wirebond 222, as well as a second portion 226. Accordingly, the wirebond 222 can provide increased RF shielding capability.

Figure 14:
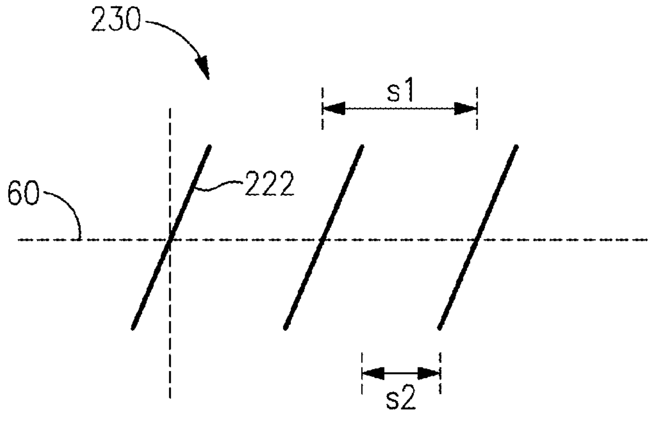
FIG. 14 shows an example configuration that is a variation of the example of FIGS. 13A and 13B, where shielding-wirebonds can be angled to provide an increase in effective density of shielding structures.

FIG. 14 shows a configuration 230 that can be a variation to the example described in reference to FIGS. 13A and 13B. A plurality of wirebonds 222 are shown to be arranged as a non-zero angle from a perpendicular of a side line 60. In such a configuration, effective spacing between conductor features of two neighboring wirebonds can be "s2," which is less than the wirebond-to-wirebond spacing of "s1." The spacing s2 can be less than s1 due to the angled configuration, in a situation where an RF emission incident on the line 60 (along a normal direction) can experience the first portion of one wirebond 222 and the second portion of the neighboring wirebond 222. In some implementations, the amount of angle and/or the direction of the angle can be selected based on one or more locations of emission hotspots relative to the shielding segment 230.

Figure 15A:
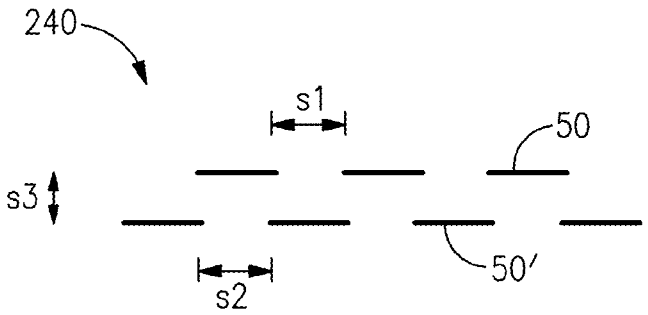
FIG. 15A and 15B show non-limiting examples of staggered configuration formed by first and second rows of wirebonds.
Figure 15B:
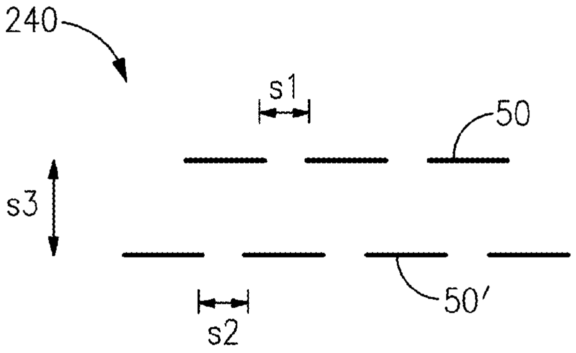

FIGS. 15A and 15B show that in some implementations, more than one row of wirebonds can be provided. In an example configuration 240, first and second rows of wirebonds 50 are shown to be disposed relative to each other in a staggered manner to provide an additional RF isolating capability. In the example shown, the two rows are shown to be separated by a distance "s3." Within the first row, the wirebonds 50 are shown to be separated from each other by a spacing of "s1." Within the second row, the wirebonds 50 are shown to be separated from each other by a spacing of "s2."

In FIG. 15A, dimensions of the wirebonds in the first row, dimensions of the wirebonds in the second row, and the spacing parameters s1 to s3 can be selected to yield a desired RF shielding capability.

In FIG. 15A, the gaps of the first row are shown to be generally covered by the wirebonds of the second row. Other arrangements are also possible. For example, FIG. 15B shows an example configuration where the wirebonds of the two rows provide partial overlaps with each other beyond the gaps. Such an arrangement can be achieved by, for example, reducing the wirebond-to-wirebond spacings s1 and s2. Similar to FIG. 15A, dimensions of the wirebonds in the first row, dimensions of the wirebonds in the second row, and the spacing parameters s1 to s3 can be selected to yield a desired RF shielding capability.

Figure 16:
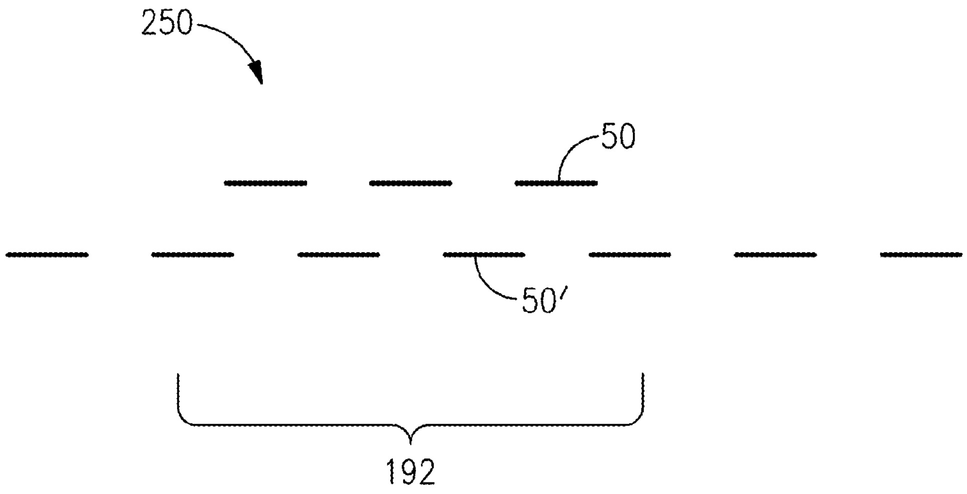
FIG. 16 shows that a section having such a staggered configuration can yield a section with increased shielding capability.

FIG. 16 shows that in some embodiments, the two-row example of FIG. 15 can be implemented to yield an increased shielding segment 192. In the example configuration 250, a first row can include a selected number of wirebonds 50 that generally covers the desired length of increased shielding (192). A second row of wirebonds 50' can extend beyond the first row. The portion where the first and second rows overlap can be the increased shielding segment 192, and the remainder of the second row (with the wirebonds 50') can function as a base-level shield.

Figure 17:
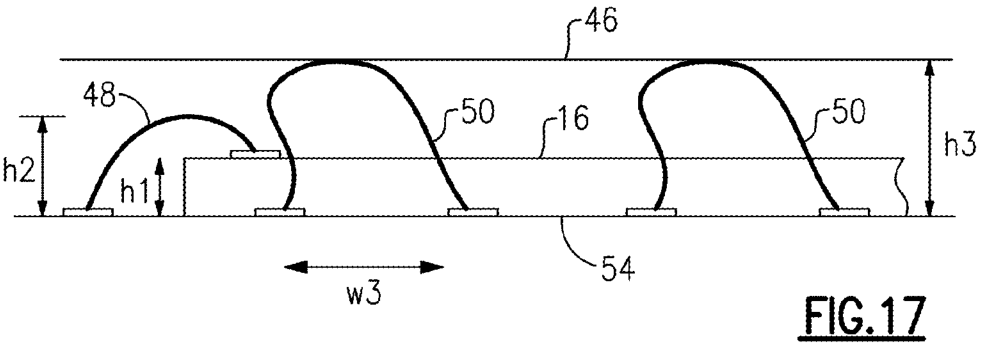
FIG. 17 shows example shielding-wirebonds dimensioned to be taller than an RF device and its connection-wirebonds to provide effective RF shielding.

FIG. 17 shows a side view of a module having an RF device 16 (height "h1") mounted on a packaging substrate 54. The RF device 16 can be connected to the module by a plurality of connection-wirebonds, and one such wirebonds is shown as 48 having a height of "h2." A plurality of shielding-wirebonds 50 are shown to have a height of "h3" and such a height typically needs to be greater than h2 and h1 so that a conductive layer 46 that provides RF shielding on top is in contact with the shielding-wirebonds 50 but not the connection-wirebonds 48.

Figure 18:
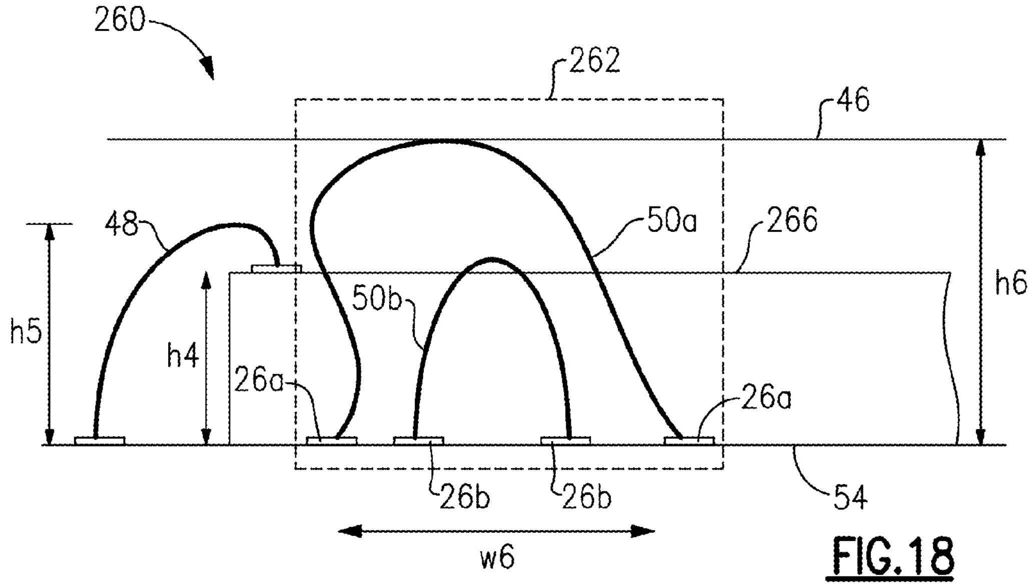
FIG. 18 shows an example shielding configuration where a shielding structure can be provided to accommodate a relatively tall RF device, where the shielding structure can include a smaller shielding-wirebond nested within a larger shielding-wirebond to provide shielding for the increased shielding area.

In some module designs, a relatively tall component may need to be included, and shielding-wirebonds need to increase in height accordingly. FIG. 18 shows an example configuration 260 where the tall component 266 (height "h4") is mounted on a packaging substrate 54. The tall component 266 is connected to the module by a plurality of connection-wirebonds 48 (height "h").

A shielding-wirebond 50*a* having a height of "h6" is shown to electrically connect a conductive layer 46 to bond pads 26*a* which are in turn connected to one or more ground planes (not shown) in the packaging substrate 54. When the height h6 is sufficiently large, shielding functionality for a given frequency may be degraded. Such a degradation can be particularly noticeable when an aspect ratio (w6/h6) of about 1 is desired for the shielding-wirebond 50*a*. For example, if the height h6 is increased by a factor of two, the area under the shielding-wirebond 50*a* increases by a factor of about four. Such a large area can allow RF signals and noises through under some circumstances.

To "plug" the relatively large area defined by the shielding-wirebond 50*a*, a second shielding-wirebond 50*b* can be provided. In the example shown in FIG. 18, the second shielding-wirebond 50*b* can be nested within the area defined by the first shielding-wirebond 50*a*, and its dimensions can be selected so that the two shielding-wirebonds 50*a*, 50*b* (collectively 262) provides a desired level of RF shielding capability. In some embodiments, the second shielding-wirebond 50*b* can be formed on one or more bond pads 26*b*, and such bond pads (26*b*) can be interconnected with the bond pads 26*a* for the first shielding-wirebond 50*a*. With such an interconnection between the first and second shielding-wirebonds 50*a*, 50*b*, the second shielding-wirebond 50*b* does not need to be connected directly to the conductive layer 46.

Figure 19:
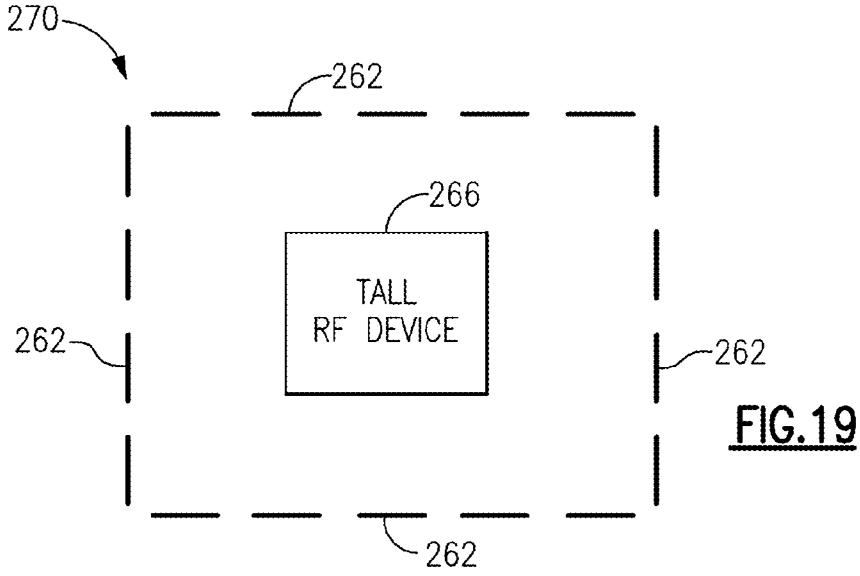
FIG. 19 shows that in some embodiments, the shielding structure of FIG. 18 can be provided partially or fully around the tall RF device.

FIG. 19 shows an example configuration 270 where a tall RF device 266 is shielded by a plurality of shielding assemblies 262 of FIG. 18. Such shielding assemblies 262 can partially or fully enclose the RF device 266.

Figure 20A:
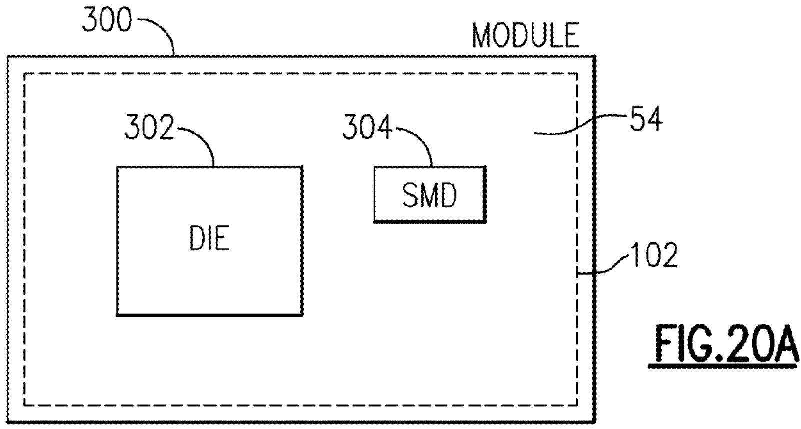
FIGS. 20A-20C show non-limiting examples of shielding configurations that can be implemented on modules using one or more features described herein.
Figure 20B:
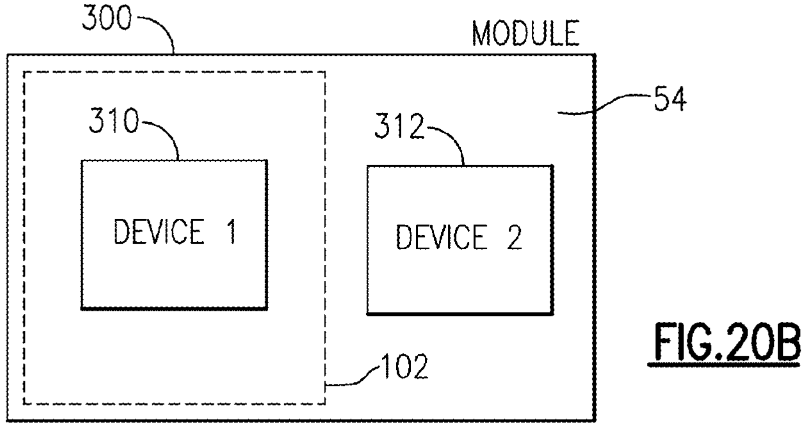
Figure 20C:
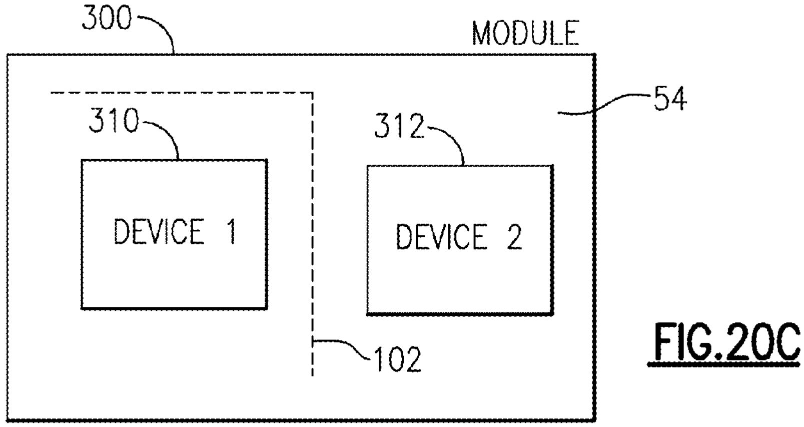

FIGS. 20A-20C show examples of how tuned RF shields 102 having one or more features described herein can be implemented in a module 300 in different manners. As described herein, such tuned RF shields 102 can include one type of shielding-wirebond structures, or different segments having different RF shielding properties.

In FIG. 20A, a tuned RF shield 102 is shown to be formed near the perimeter of a module 300 to substantially enclose most of the module's area. Components such as one or more dies 302 and one or more surface-mount devices (SMDs) mounted on such an enclosed area can benefit from the RF shielding properties of the RF shield 102.

In FIG. 20B, a tuned RF shield 102 is shown to be formed around one device 310 mounted on a module 300, but not around another device 312. Such a configuration can be implemented if the second device 312, for example, does not produce RF emissions and is generally not susceptible to interference from RF signals or noises. Such a configuration can reduce the amount of shielding-wirebonds utilized in the module 300.

In FIG. 20C, a tuned RF shield 102 is shown to be formed only partially about one device 310 mounted on a module 300. Such a configuration can be implemented if RF emissions and susceptibilities associated with the first device 310 is sufficiently localized and directional, so that a full enclosure with shielding-wirebonds is not needed. In FIG. 20C, the second device 312, similar to the example of FIG. 20B, does not produce RF emissions and is generally not susceptible to interference from RF signals or noises.

Other configurations are also possible.

In some implementations, a device having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 21:
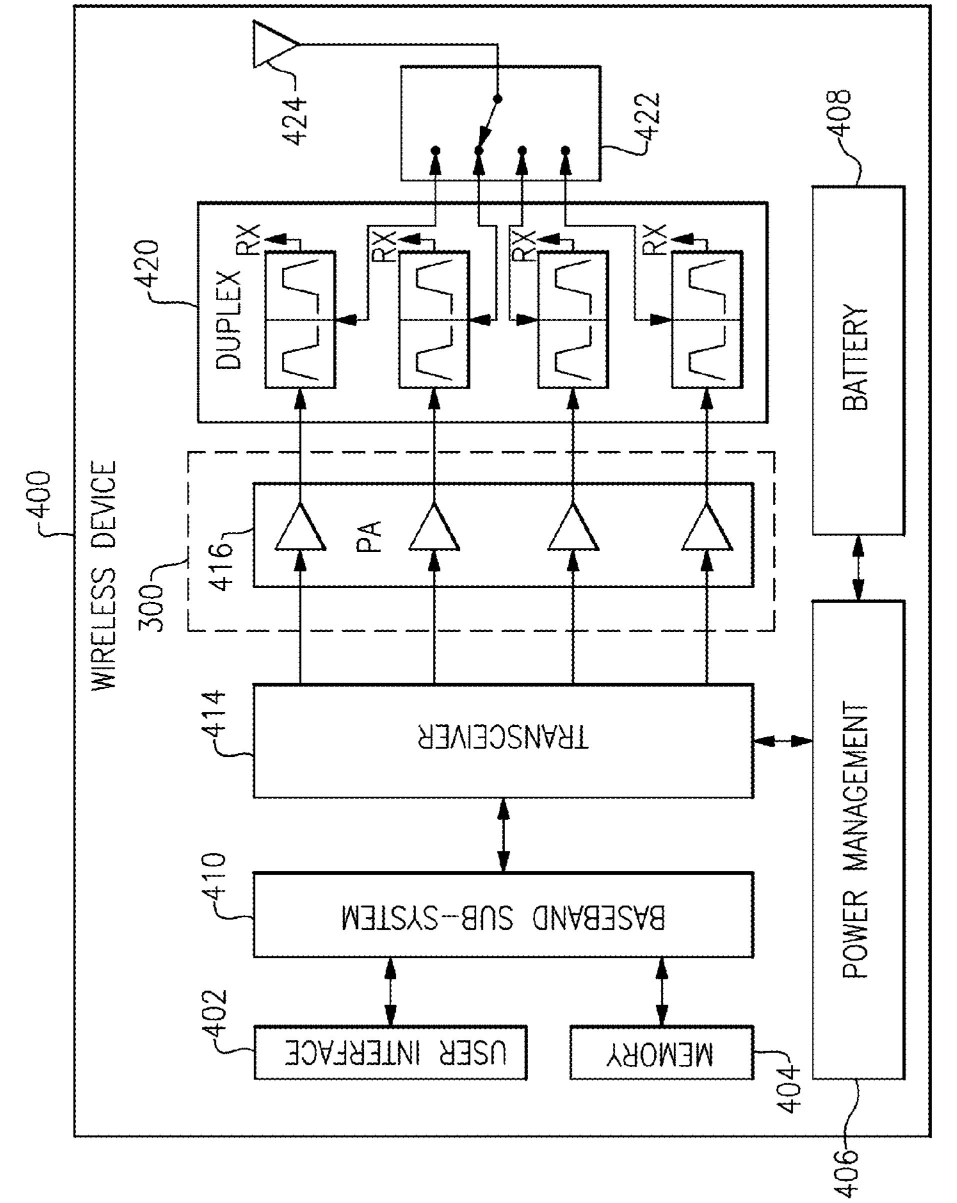
FIG. 21 shows an example wireless device having a shielded module as described herein.

FIG. 21 schematically depicts an example wireless device 400 having one or more advantageous features described herein. In the context of a module having tuned RF shielding with one or more features as described herein, such a module can include a power amplifier (PA) module 300 having one or more PAs, and at least some of such PAs shielded as described herein. Other modules associated with the wireless device 400 can also be shielded in similar manners.

In the example wireless device 400, the shielded PA module 300 having can provide an amplified RF signal to a switch 422 (via a duplexer 420), and the switch 422 can route the amplified RF signal to an antenna 424. The PA module 300 can receive an unamplified RF signal from a transceiver 414 that can be configured and operated in known manners.

The transceiver 414 can also be configured to process received signals. Such received signals can be routed to one or more LNAs (not shown) from the antenna 424, through the duplexer 420.

The transceiver 414 is shown to interact with a baseband sub-system 410 that is configured to provide conversion between data and/or voice signals suitable for a user and RF signals suitable for the transceiver 414. The transceiver 414 is also shown to be connected to a power management component 406 that is configured to manage power for the operation of the wireless device 400.

The baseband sub-system 410 is shown to be connected to a user interface 402 to facilitate various input and output of voice and/or data provided to and received from the user. The baseband sub-system 410 can also be connected to a memory 404 that is configured to store data and/or instructions to facilitate the operation of the wireless device, and/or to provide storage of information for the user.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency (RF) module comprising:

a packaging substrate configured to receive a plurality of components;

a plurality of RF components mounted on the packaging substrate and configured to facilitate processing of an RF signal; and an RF shield disposed relative to at least one of the RF components, the RF shield including a segment configured to provide a base-level of shielding, the RF shield configured to provide selective shielding capability based on either or both of an RF emission pattern and height dimensions associated with the RF components, the selective shielding capability provided by an enhanced segment of the RF shield configured to provide an enhanced level of shielding that is greater than the base-level.

2. The module of claim 1 wherein the plurality of RF components includes a power amplifier die.

3. The module of claim 1 wherein the enhanced segment includes a higher density of shielding-wirebonds relative to a density associated with the base-level of shielding.

4. The module of claim 1 wherein the enhanced segment includes a corner shielding-wirebond disposed at a corner of the RF shield, the corner shielding-wirebond configured to provide additional shielding at the corner.

5. The module of claim 1 wherein the enhanced segment includes one or more shielding-wirebonds oriented so that planes associated with the shielding-wirebonds are at a non-zero angle relative to a line representative of the enhanced segment.

6. The module of claim 5 wherein the non-zero angle is approximately 90 degrees.

7. The module of claim 1 wherein the enhanced segment includes a first row of shielding-wirebonds offset laterally from a second row of shielding-wirebonds.

8. The module of claim 7 wherein the shielding-wirebonds of the first row are arranged in a stagger configuration relative to the shielding-wirebonds of the second row.

9. The module of claim 7 wherein one of the first and second rows is part of the segment that provides the base-level of shielding.

10. The module of claim 1 wherein the enhanced segment includes one or more assemblies of shielding-wirebonds, each assembly including a first shielding-wirebond and a second shielding-wirebond that is nested within an area defined by the first shielding-wirebond.

11. The module of claim 10 wherein the second shielding-wirebond is dimensioned to provide RF shielding within the area defined by the first shielding-wirebond.

12. The module of claim 11 wherein the area defined by the first shielding-wirebond has an aspect ratio of about 1.

13. The module of claim 1 wherein the RF shield includes a segment configured to provide shielding between a first region and a second region, both of the first and second regions being on the module.

14. The module of claim 1 wherein the RF shield includes a segment configured to provide shielding between a region on the module and a location outside of the module.

15. The module of claim 1 wherein the RF shield partially surrounds the at least one RF component.

16. The module of claim 1 wherein the RF shield fully surrounds the at least one RF component.

17. The module of claim 16 further comprising a conductive layer disposed over the at least one RF component and electrically connected to an upper portion of the RF shield.

18. The module of claim 17 further comprising a ground plane disposed below the at least one RF component and electrically connected to a lower portion of the RF shield, the conductive layer, the RF shield, and the ground plane providing a shielded volume for the at least one RF component.

19. A wireless device comprising:

an antenna; and a module in communication with the antenna, the module configured to facilitate either or both of transmission and reception of RF signals through the antenna, the module including a packaging substrate configured to receive a plurality of components, a plurality of RF components mounted on the packaging substrate and configured to facilitate processing of an RF signal, and an RF shield disposed relative to at least one of the RF components, the RF shield including a segment configured to provide a base-level of shielding, the RF shield configured to provide selective shielding capability based on either or both of an RF emission pattern and height dimensions associated with the RF components, the selective shielding capability provided by an enhanced segment of the RF shield configured to provide an enhanced level of shielding that is greater than the base-level.

* * * * *

UNITED STATES PATENT AND TRADEMARK OFFICE

CERTIFICATE OF CORRECTION

PATENT NO. : 9,071,335 B2
APPLICATION NO. : 13/543084
DATED : June 30, 2015
INVENTOR(S) : Anil K. Agarwal et al.

It is certified that error appears in the above-identified patent and that said Letters Patent is hereby corrected as shown below:

In the Specification

At column 9, line 22, please delete "“h3”" and insert --“h3,”--, therefor.

At column 9, line 33, please delete "“h”)." and insert --“h5”).--, therefor.

Signed and Sealed this
Twenty-sixth Day of July, 2016

Michelle K. Lee
*Director of the United States Patent and Trademark Office*